(12) United States Patent
Nishiguchi et al.

(10) Patent No.: US 10,254,346 B2
(45) Date of Patent: Apr. 9, 2019

(54) SOC ESTIMATION DEVICE FOR SECONDARY BATTERY

(71) Applicant: MITSUBISHI ELECTRIC CORPORATION, Chiyoda-ku (JP)

(72) Inventors: Hiroto Nishiguchi, Chiyoda-ku (JP); Hisatoshi Fukumoto, Chiyoda-ku (JP); Shingo Yamaguchi, Chiyoda-ku (JP)

(73) Assignee: MITSUBISHI ELECTRIC CORPORATION, Chiyoda-ku (JP)

( * ) Notice: Subject to any disclaimer, the term of this patent is extended or adjusted under 35 U.S.C. 154(b) by 122 days.

(21) Appl. No.: 15/115,794

(22) PCT Filed: Nov. 28, 2014

(86) PCT No.: PCT/JP2014/081579
§ 371 (c)(1),
(2) Date: Aug. 1, 2016

(87) PCT Pub. No.: WO2015/129117
PCT Pub. Date: Sep. 3, 2015

(65) Prior Publication Data
US 2017/0010327 A1    Jan. 12, 2017

(30) Foreign Application Priority Data
Feb. 25, 2014   (JP) .................. 2014-033633

(51) Int. Cl.
*H02J 7/00* (2006.01)
*G01R 31/36* (2006.01)
*G01R 31/44* (2006.01)

(52) U.S. Cl.
CPC ....... *G01R 31/362* (2013.01); *G01R 31/3651* (2013.01); *G01R 31/3679* (2013.01);
(Continued)

(58) Field of Classification Search
CPC .............. G01R 31/362; G01R 31/3651; G01R 31/3679; G01R 31/44; G01R 31/3624
See application file for complete search history.

(56) References Cited

U.S. PATENT DOCUMENTS

2004/0162683 A1* 8/2004 Verbrugge ........... G01R 31/361
702/64
2005/0231164 A1* 10/2005 Melichar ............... H02J 7/0047
320/132

(Continued)

FOREIGN PATENT DOCUMENTS

JP       2003-168489 A      6/2003
JP       2004-085269 A      3/2004
(Continued)

OTHER PUBLICATIONS

International Search Report dated Mar. 10, 2015 for PCT/JP2014/081579 filed on Nov. 28, 2014.

*Primary Examiner* — Stephanie E Bloss
(74) *Attorney, Agent, or Firm* — Oblon, McClelland, Maier & Neustadt, L.L.P.

(57) ABSTRACT

A State of Charge (SOC) estimation device is provided for a secondary battery in which a correlation curve indicating a relationship between an SOC and Open Circuit Voltage (OCV) differs between a charging process and discharging process. The SOC estimation device estimates the SOC based on a relational formula in which as measured OCV increases, weights are assigned to the correlation curve for the discharging process, and as the measured OCV decreases, weights are assigned to the correlation curve for the charging process. Thus, the SOC estimation device provides accurate SOC estimates regardless of whether the secondary battery is being used or not.

4 Claims, 8 Drawing Sheets (52) U.S. Cl.
CPC .......... *G01R 31/44* (2013.01); *G01R 31/3624* (2013.01); *H02J 2007/005* (2013.01)

(56) References Cited

U.S. PATENT DOCUMENTS

| | | | | |
|---|---|---|---|---|
| 2012/0035873 A1* | 2/2012 | Kang | ................. | G01R 31/3648 702/63 |
| 2012/0166116 A1* | 6/2012 | Yoshida | ............. | G01R 31/3624 702/63 |
| 2012/0293131 A1* | 11/2012 | Nakamura | ........... | G01R 31/361 320/134 |
| 2014/0368208 A1* | 12/2014 | Yamada | ................ | H01M 10/48 324/433 |

FOREIGN PATENT DOCUMENTS

| | | | |
|---|---|---|---|
| JP | 2009-519468 | A | 5/2009 |
| JP | 2009-519469 | A | 5/2009 |
| JP | 2012-042429 | A | 3/2012 |
| JP | 2013-105519 | A | 5/2013 |
| JP | 2013-158087 | A | 8/2013 |
| JP | 2014-025739 | A | 2/2014 |
| JP | 2014-059206 | A | 4/2014 |
| WO | 2011/090020 | A1 | 7/2011 |
| WO | 2014/080595 | A1 | 5/2014 |

* cited by examiner

SOC ESTIMATION DEVICE FOR SECONDARY BATTERY

TECHNICAL FIELD

The present invention relates to an SOC (State of Charge) estimation device for a secondary battery.

BACKGROUND ART

Secondary batteries are used in various types of applications such as electronic devices, elevators, transport devices such as vehicles and electric storage devices, and they have various sizes. In order to take full advantage of such secondary batteries, it is important to accurately estimate the SOC of the secondary batteries. When a significant error in the estimation of the SOC of the secondary battery is produced, since charging or discharging is performed beyond an allowable range, the secondary battery is disadvantageously expanded or increased in temperature. For example, a short circuit occurs, when the negative electrode collector foil of a secondary battery is electrically dissolved by over-discharging and precipitated again, whereby the negative electrode collector foil penetrates a separator. Consequently, a large amount of current is passed instantaneously to generate heat, and thus an electrolyte is evaporated. By over-charging, the electrolyte or the electrode material of the secondary battery is decomposed. When an internal pressure is increased by a gas produced by the heat generation or the decomposition reaction described above, the secondary battery is expanded. Hence, in order to take full advantage of a secondary battery while preventing the over-charging or the over-discharging of the secondary battery, it is necessary to accurately grasp the SOC of the secondary battery.

As a method for estimating the SOC of the secondary battery, a method using the OCV (Open Circuit Voltage) of the secondary battery is generally known. This method is a method for estimating the SOC by producing, in advance, a correlation curve of the SOC to the OCV of the secondary battery and introducing, into this correlation curve, an actually measured OCV which is measured during the use of the secondary battery.

However, depending on the constituent material of the secondary battery, a hysteresis may occur in which a correlation curve indicating a relationship between the SOC and the OCV differs between a charging process and a discharging process. When such a hysteresis occur, it is disadvantageously impossible to accurately estimate the SOC from the actually measured OCV.

Hence, in order to solve this problem, patent document 1 proposes a method for determining a correlation curve indicating a relationship between the SOC and the OCV for each SOC when switching from charging to discharging is performed, and measuring the SOC from an actually measured OCV based on this correlation curve.

REFERENCE

Patent Document

Patent Document 1: JP 2013-105519 A

DISCLOSURE OF THE INVENTION

Problems to be Solved by the Invention

However, the OCV of the secondary battery is changed not only when the secondary battery is used but also when the use of the secondary battery is stopped, and particularly after the use of the secondary battery is stopped for a long period of time, a significant variation in the OCV is produced when the use thereof is started. In a method and a device disclosed in patent document 1, no consideration is given to this point, and a significant error is disadvantageously produced in the estimation of the SOC immediately after the use of the secondary battery is started.

The present invention is made in order to solve such a problem, and has an object to provide, in a secondary battery in which a correlation curve indicating a relationship between an SOC and an OCV differs between a charging process and a discharging process, the SOC estimation device for the secondary battery with which it is possible to accurately estimate the SOC not only when the secondary battery is used but also when the use of the secondary battery is started after stopping use of the secondary battery.

Means for Solving the Problems

The present inventors have conducted thorough research in order to solve the problem described above, and consequently have found that in a secondary battery in which a correlation curve indicating a relationship between an SOC and an OCV differs between a charging process and a discharging process, a tendency of the correlation curve indicating the relationship between the SOC and the OCV in either the charging process or the discharging process differs significantly depending on the magnitude of an actually measured OCV, and that it is possible to accurately estimate the SOC by using a relational formula weighted to this tendency. They have also found that there is a similar tendency in an SOC calculated from a charge amount obtained by summing the charging current and the discharging current of the secondary battery, and that it is possible to accurately estimate the SOC by using a relational formula weighted to this tendency.

That is, the present invention is an SOC estimation device for a secondary battery in which a correlation curve indicating a relationship between an SOC and an OCV differs between a charging process and a discharging process, the SOC estimation device including a means for estimating the SOC based on a relational formula in which as the actually measured OCV is increased, weights are assigned to the correlation curve indicating the relationship between the SOC and the OCV in the discharging process and as the actually measured OCV is decreased, weights are assigned to the correlation curve indicating the relationship between the SOC and the OCV in the charging process.

Further, the present invention is an SOC estimation device for a secondary battery in which a correlation curve indicating a relationship between an SOC and an OCV differs between a charging process and a discharging process, the SOC estimation device including a means for estimating the SOC based on a relational formula in which as the SOC calculated from a charge amount obtained by summing a charging current and a discharging current of the secondary battery is increased, weights are assigned to the correlation curve indicating the relationship between the SOC and the OCV in the discharging process and as the SOC calculated from the charge amount obtained by summing the charging current and the discharging current of the secondary battery is decreased, weights are assigned to the correlation curve indicating the relationship between the SOC and the OCV in the charging process.

Effects of the Invention

The present invention can provide, in a secondary battery in which a correlation curve indicating a relationship between an SOC and an OCV differs between a charging process and a discharging process, the SOC estimation device for the secondary battery with which it is possible to accurately estimate the SOC not only when the secondary battery is used but also when the use of the secondary battery is started after the use of the secondary battery is stopped.

BEST MODE FOR CARRYING OUT THE INVENTION

Preferred embodiments of the SOC estimation device for a secondary battery according to the present invention will be described below with reference to drawings. Although in the embodiments below, description will be given using, as an example of the secondary battery, a lithium ion secondary battery, the present invention is not limited to this example, and the present invention can likewise be used with other secondary batteries.

First Embodiment

Figure 1:
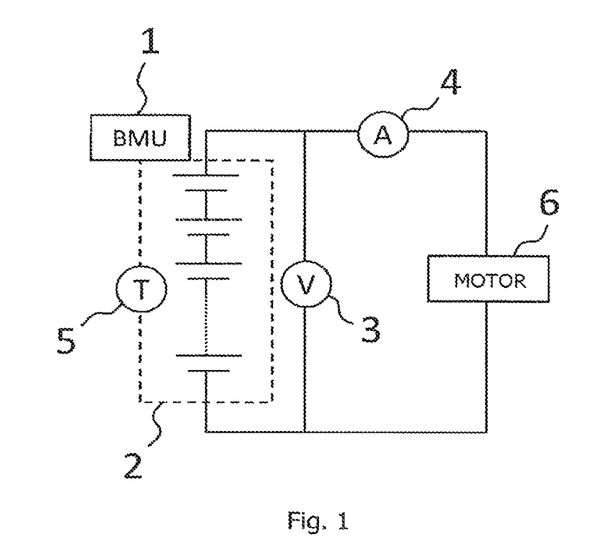
FIG. 1 is a diagram showing the configuration of a secondary battery system which includes an SOC estimation device for a secondary battery according to the present invention.

FIG. 1 is a diagram showing the configuration of a secondary battery system which includes the SOC estimation device for the secondary battery according to the present invention. As shown in FIG. 1, the secondary battery system includes a BMU (Battery Management Unit) 1 which performs control on the secondary battery 2, the secondary battery 2, a voltage sensor 3 which measures a voltage between terminals in the secondary battery 2, a current sensor 4 which measures an energizing current and a temperature sensor 5 which measures a battery temperature, and is connected to a motor 6 which consumes the power of the secondary battery 2 or regenerates the power of the secondary battery 2. In this configuration, the BMU 1 includes the SOC estimation device of the present invention. Although not shown in the figure, in the secondary battery system, between the secondary battery 2 and the motor 6, a converter which steps the voltage of the secondary battery 2 up and down, an inverter which converts between a direct current and an alternating current or the like may be provided. The number of secondary batteries 2 is not limited to one, and the secondary batteries 2 may be used as a battery module in which a plurality of secondary batteries 2 are connected in series or parallel or are combined. Here, although various types of information may be measured or estimated for each of the secondary batteries 2, various types of information may be obtained by measuring or estimating various types of information for each plurality of secondary batteries 2 and averaging them.

Figure 2:
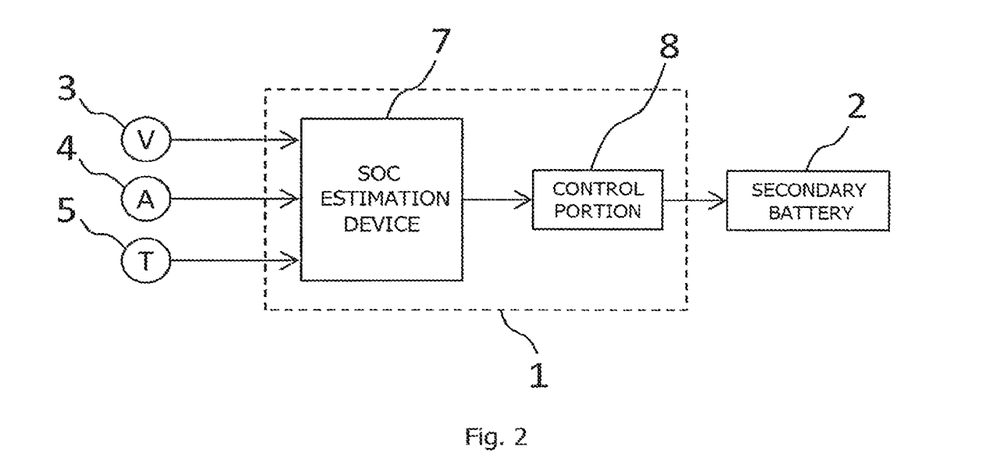
FIG. 2 is a diagram showing the configuration of a control system of a BMU.

FIG. 2 is a diagram showing the configuration of the control system of the BMU 1. As shown in FIG. 2, in the control system of the BMU 1, information on the voltage between the terminals of the secondary battery 2 measured by the voltage sensor 3, the energizing current measured by the current sensor 4 and the battery temperature measured by the temperature sensor 5 are input to the SOC estimation device 7 of the BMU 1, and based on this information, the SOC estimation device 7 estimates the SOC. Then, based on the SOC estimated in the SOC estimation device 7 and the information from the sensors, a control portion 8 provides an instruction to control the charging and discharging of the secondary battery 2.

A method for estimating the SOC in the SOC estimation device 7 will now be described.

Figure 3:
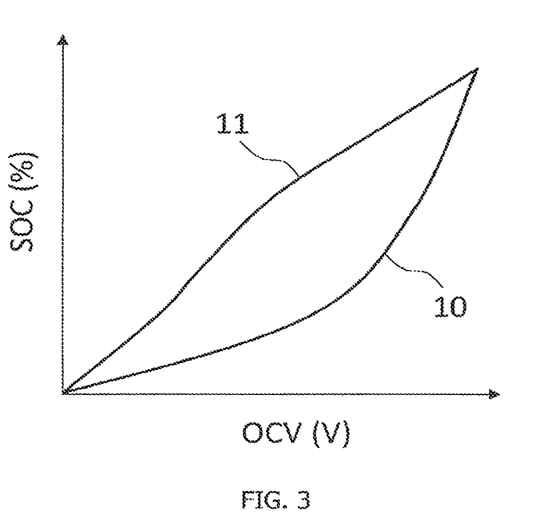
FIG. 3 is a graph showing a correlation curve indicating a relationship between an SOC and an OCV of a secondary battery in which the correlation curve indicating the relationship between the SOC and the OCV differs between a charging process and a discharging process.

FIG. 3 is a graph showing a correlation curve indicating a relationship between the SOC and the OCV of the secondary battery 2 in which the correlation curve indicating the relationship between the SOC and the OCV differs between the charging process and the discharging process. As shown in FIG. 3, when the secondary battery 2 is charged, as the SOC is increased from 0 to 100%, the OCV is increased according to a correlation curve 10 indicating the relationship between the SOC and the OCV in the charging process. In contrast, when the secondary battery 2 is discharged, as the SOC is lowered from 100 to 0%, the OCV is decreased according to a correlation curve 11 indicating the relationship between the SOC and the OCV in the discharging process. The correlation curve indicating the relationship between the SOC and the OCV differs between the charging process and the discharging process, and thus a hysteresis occurs.

Here, the correlation curve 10 indicating the relationship between the SOC and the OCV in the charging process can be obtained by measuring the OCV each time the secondary battery 2 is charged by a predetermined capacity, from a state in which a sufficient stop time has elapsed after the secondary battery 2 is discharged until the SOC of the secondary battery 2 reaches 0%. The correlation curve 11 indicating the relationship between the SOC and the OCV in the discharging process can be obtained by measuring the OCV each time the secondary battery 2 is discharged by a predetermined capacity, from a state in which a sufficient stop time has elapsed after the secondary battery 2 is charged until the SOC of the secondary battery 2 reaches 100%. When charging or discharging is performed by the predetermined capacity, since a behavior is seen in which the voltage is increased and decreased at the time of the stop after the charging or discharging, the OCV is measured after a certain amount of time has elapsed which removes the behavior to some extent. Such a certain amount of time to remove the behavior to some extent is not particularly limited but is generally about 1 hour.

The hysteresis in which the correlation curve indicating the relationship between the SOC and the OCV differs between the charging process and the discharging process mainly results from the materials of the electrodes of the secondary battery 2. Specifically, a positive electrode active substance used in a positive electrode and a negative electrode active substance used in a negative electrode are substances which mainly cause the hysteresis to be produced.

The positive electrode active substance used in the lithium ion secondary battery is formed of a metal oxide containing lithium, and the condition of the occurrence of the hysteresis is changed by such a constituent material. The negative electrode active substance is mainly formed of a carbon material such as graphite or hard carbon, and there is a tendency that the hysteresis is increased in the negative electrode using hard carbon as the negative electrode active substance, as compared with the negative electrode using graphite as the negative electrode active substance.

A large factor in increasing the hysteresis in the lithium ion secondary battery having the negative electrode which uses hard carbon as the negative electrode active substance can be considered to be the following.

When graphite is used as the negative electrode active substance, at the time of charging, lithium is inserted between graphene layers formed by the coupling of carbon in the shape of a flat surface. On the other hand, since in hard carbon, graphene layers are not developed as compared with graphite, when this is used as the negative electrode active substance, two states, that is, a state in which lithium is inserted between the graphene layers (hereinafter referred to as an "inserted state" in short) and a state in which lithium is coupled to carbon at the ends of the graphene layers (hereinafter referred to as a "coupled state" in short), are present in a mixed manner.

When hard carbon is used as the negative electrode active substance, in the charging process of the lithium ion secondary battery, lithium is preferentially inserted into the graphene layer whose energy level is low. When the amount of lithium, in the inserted state, is increased as the charge amount is increased, the potential energy of the lithium in the inserted state is increased. When charging is further continued, the energy level of part of the lithium in the inserted state exceeds the energy level between the lithium in the inserted state and the lithium in the coupled state, with the result that the lithium in the inserted state is gently changed into the lithium in the coupled state.

Since in the charging process of the lithium ion secondary battery, charging is performed in advance so as to achieve a high SOC, a large amount of lithium in the coupled state is present. Although the desorption of lithium at the time of discharging is preferentially developed from the lithium in the inserted state, as the amount of discharging is increased, the energy level of the lithium in the inserted state is lowered more than that of the lithium in the coupled state. Consequently, although part of the lithium in the coupled state is changed into lithium in the inserted state, since the changing speed is gentle, a state different from the charging process is achieved even though the same amount of lithium is accumulated in a short period of time.

As described above, even though the same amount of lithium is accumulated in the charging process and the discharging process, when the state in which lithium is present is different, a difference in the potential of the negative electrode is produced, with the result that hysteresis occurs. When discharging is continued at a low SOC, the change of lithium in the coupled state into lithium in the inserted state is promoted. In the charging and discharging processes described above, at the time of charging, at the SOC where the change of lithium in the inserted state into lithium in the coupled state is started, the width of the hysteresis is maximized.

Since the OCV in the discharging process where a large amount of lithium in the coupled state is present is lower than the OCV in the charging process when they are compared at the same SOC, the accumulated amount of lithium in the coupled state only slightly affects the potential of the negative electrode, with the result that it can be considered that the accumulated amount of lithium in the inserted state varies the potential of the negative electrode.

Lithium in the negative electrode is gently changed until the reaction speed reaches equilibrium between the two states described above, and is brought, over a long period of time, into a state which matches the amount of lithium accumulated in the negative electrode. Hence, during the stop time after the charging and discharging of the lithium ion secondary battery are stopped, a gentle variation is produced in the OCV. The variation in the OCV is determined by the amount of lithium accumulated in the negative electrode.

Figure 4:
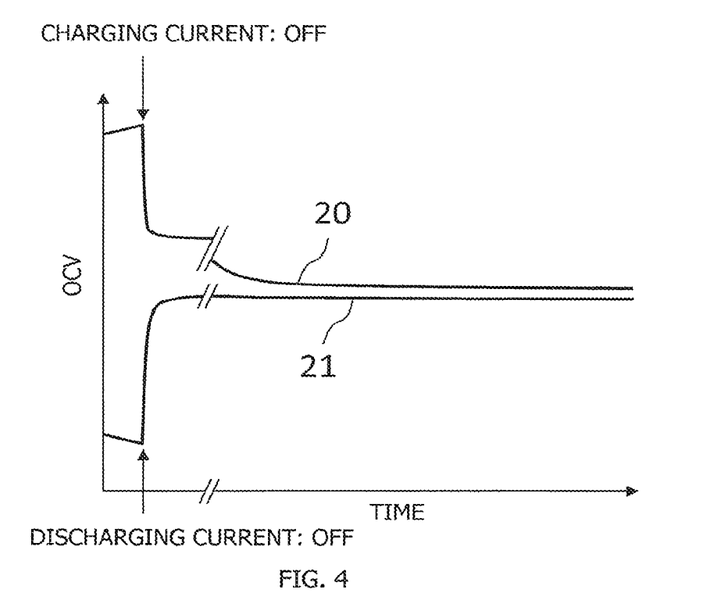
FIG. 4 is a graph showing variations in the OCV with time in a lithium ion secondary battery when, during the charging process and the discharging process, a no load state is retained over a long period of time after an energizing current is stopped at a specific SOC indicating a sufficiently high OCV.

FIG. 4 is a graph showing, in order to check variations in the OCV in the stopped state of the lithium ion secondary battery, variations in the OCV with time in the lithium ion secondary battery when in the charging process and the discharging process, the state is retained at no load over a long period of time after the energizing current is stopped in a specific SOC indicating a sufficiently high OCV. When the state is retained at no load over a long period of time in the specific SOC indicating a sufficiently high OCV, as shown in FIG. 4, there is a tendency that in an OCV 20 when the energization is stopped in the charging process, the variation time is longer than in an OCV 21 when the energization is stopped in the discharging process. The OCV 20 when the energization is stopped in the charging process tends to be brought close to the OCV 21 when the energization is stopped in the discharging process. In particular, as the OCV when the energizing current is stopped is higher, there is a greater tendency that the OCV 20 when the energization is stopped in the charging process is brought close to the OCV 21 when the energization is stopped in the discharging process.

Figure 5:
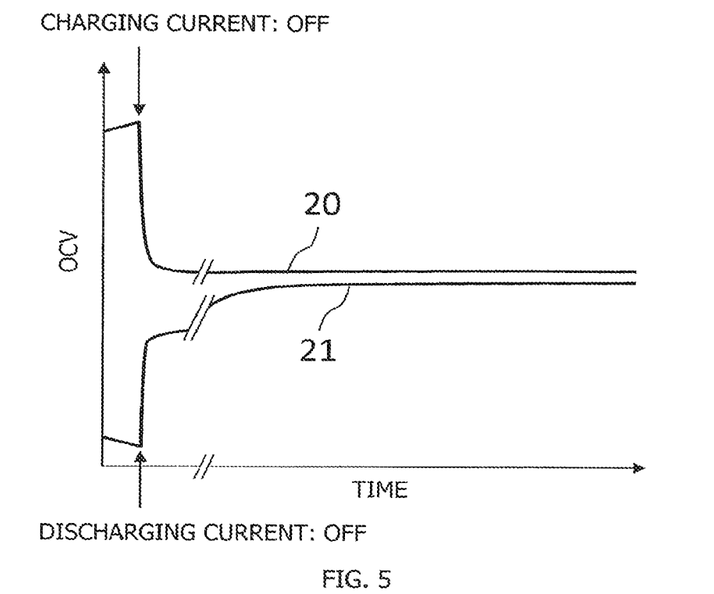
FIG. 5 is a graph showing variations in the OCV with time in the lithium ion secondary battery when, during the charging process and the discharging process, a no load state is retained over a long period of time after the energizing current is stopped at a specific SOC indicating a sufficiently low OCV.

FIG. 5 is a graph showing, in order to check the amount of variation in the OCV in the stopped state of the lithium ion secondary battery, variations in the OCV with time in the lithium ion secondary battery when in the charging process and the discharging process, the state is retained at no load over a long period of time after the energizing current is stopped in a specific SOC indicating a sufficiently low OCV. When the state is retained at no load over a long period of time in the specific SOC indicating a sufficiently low OCV, as shown in FIG. 5, there is a tendency that in the OCV 21 when the energization is stopped in the discharging process, the variation time is longer than in the OCV 20 when the energization is stopped in the charging process. The OCV 21 when the energization is stopped in the discharging process tends to be brought close to the OCV 20 when the energization is stopped in the charging process. In particular, as the OCV when the energizing current is stopped is lower, there is a greater tendency that the OCV 21 when the energization is stopped in the discharging process is brought close to the OCV 20 when the energization is stopped in the discharging process.

In the tendency described above, a relational formula is used in which as an actually measured OCV is higher, weights are assigned to the correlation curve 11 indicating the relationship between the SOC and the OCV in the discharging process whereas as the actually measured OCV is lower, weights are assigned to the correlation curve 10 indicating the relationship between the SOC and the OCV in the charging process, and thus it can be considered that with consideration given to the stopped state of the secondary battery 2, it is possible to more accurately estimate the SOC of the secondary battery 2.

One or more relational formulae in which weights are assigned as described above may be used. When a plurality of relational formulae are used, the range of the OCV is divided into a plurality of parts, and a ratio, close to the correlation curve 10 indicating the relationship between the SOC and the OCV in the charging process or the correlation curve 11 indicating the relationship between the SOC and the OCV in the charging process, is changed according to the magnitude of the actually measured OCV.

Figure 6:
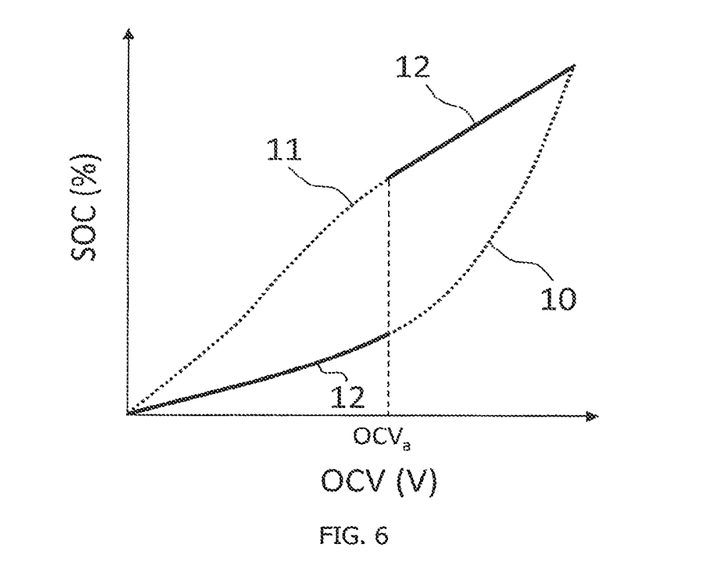
FIG. 6 shows an example where as relational formulae in which weights are assigned, two relational formulae formed by dividing the range of the OCV into two parts are used.

FIG. 6 shows an example where as the relational formulae in which weights are assigned, two relational formulae formed by dividing the range of the OCV into two parts are used. As shown in FIG. 6, the two relational formulae 12 are divided into two parts by an $OCV_a$, and the relational formula 12 in which weights are assigned to the correlation curve 10 indicating the relationship between the SOC and the OCV in the charging process and the relational formula 12 in which weights are assigned to the correlation curve 11 indicating the relationship between the SOC and the OCV in the discharging process are provided. When the actually measured OCV is less than the $OCV_a$, the SOC is calculated by introducing the actually measured OCV into the correlation curve 10 indicating the relationship between the SOC and the OCV in the charging process. When the actually measured OCV is more than a threshold OCV 12, the SOC is calculated by introducing the actually measured OCV into the correlation curve 11 indicating the relationship between the SOC and the OCV in the discharging process.

A method for setting the $OCV_a$ which divides the range of the OCV into two parts is not particularly limited but the OCV is preferably set to 30 to 70% of the maximum value of the OCV in the charging and discharging processes, is more preferably set to 40 to 60% and is most preferably set to 50%.

Figure 7:
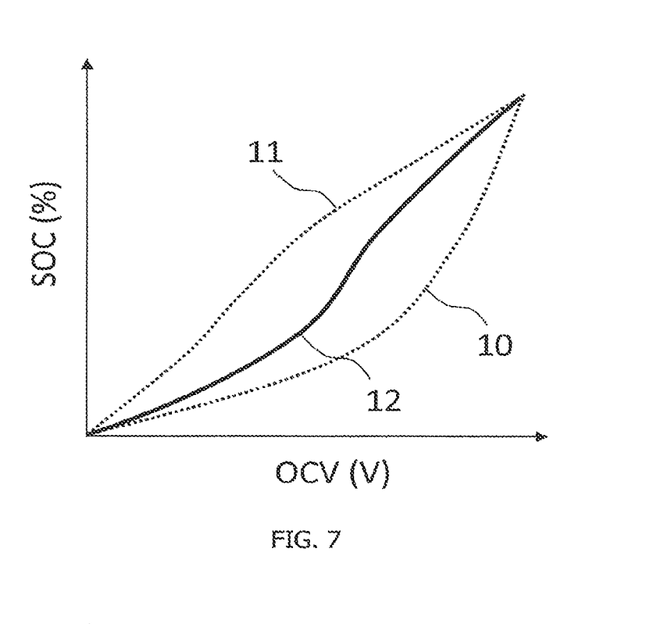
FIG. 7 shows an example where as the relational formula in which weights are assigned, one relational formula is used.

FIG. 7 shows an example where as the relational formula in which weights are assigned, one relational formula is used. As shown in FIG. 7, in the one relational formula 12, as the actually measured OCV is higher, weights are assigned to the correlation curve 11 indicating the relationship between the SOC and the OCV in the discharging process whereas when the actually measured OCV is lower, weights are assigned to the correlation curve 10 indicating the relationship between the SOC and the OCV in the charging process. The SOC is calculated by introducing the actually measured OCV into the relational formula 12.

As the actually measured OCV is lower, the SOC calculated by introducing the actually measured OCV into the correlation curve 10 indicating the relationship between the SOC and the OCV in the charging process becomes more accurate whereas as the actually measured OCV is higher, the magnitude of error is increased. In contrast, as the actually measured OCV is higher, the SOC calculated by introducing the actually measured OCV into the correlation curve 11 indicating the relationship between the SOC and the OCV in the discharging process becomes more accurate whereas as the actually measured OCV is lower, the magnitude of error is increased. Hence, in the relational formula 12, the SOC calculated by introducing the actually measured OCV into the correlation curve 10 indicating the relationship between the SOC and the OCV in the charging process and the SOC calculated by introducing the actually measured OCV into the correlation curve 11 indicating the relationship between the SOC and the OCV in the discharging process are synthesized using a weight coefficient which is changed according to the magnitude of the actually measured OCV, and thus it is possible to cancel out the mutual disadvantages and maximize the advantages. The relational formula 12 is expressed by, for example, the formula below.

$$SOC_e = \alpha \times SOC_d + (1-\alpha) \times SOC_c$$

where $SOC_e$ is an SOC which is estimated, $SOC_d$ is an SOC which is calculated by introducing the actually measured OCV into the correlation curve 11 indicating the relationship between the SOC and the OCV in the discharging process, $SOC_c$ is an SOC which is calculated by introducing the actually measured OCV into the correlation curve 10 indicating the relationship between the SOC and the OCV in the charging process and α is a weight coefficient. The weight coefficient α has a value of 0 to 1, and as the actually measured OCV is higher, the weight coefficient a is brought close to 1 whereas as the actually measured OCV is lower, the weight coefficient α is brought close to 0. Hence, the weight coefficient α is preferably set such that as the actually measured OCV is higher, the weight coefficient α is sequentially increased.

With the SOC estimation device 7 of the present embodiment which estimates the SOC as described above, in the secondary battery 2 in which the correlation curve indicating the relationship between the SOC and the OCV differs between the charging process and the discharging process, not only when the secondary battery 2 is being used but also when the use is started after the use of the secondary battery 2 is stopped, it is possible to accurately estimate the SOC with the actually measured OCV.

Second Embodiment

In the present embodiment, a description will be given of the SOC estimation device 7 of the secondary battery 2 using relational formula 12 in which the accuracy of the estimation of the SOC is enhanced by further adding, to the relational formula 12 of the first embodiment, conditions on which an actual event in the secondary battery 2 is reflected.

Figure 8:
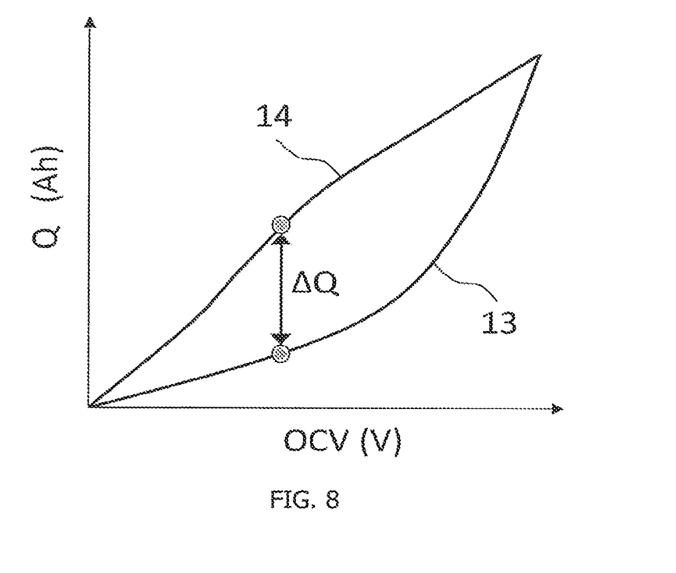
FIG. 8 is a graph showing a correlation curve indicating a relationship between a charge amount Q and the OCV in the secondary battery in which the correlation curve indicating the relationship between the SOC and the OCV differs between the charging process and the discharging process.

FIG. 8 is a graph showing a correlation curve indicating a relationship between a charge amount Q and an OCV in the secondary battery 2 in which the correlation curve indicating the relationship between the SOC and the OCV differs between the charging process and the discharging process. As shown in FIG. 8, when the secondary battery 2 is charged, as the OCV is increased, the charge amount Q is increased according to a correlation curve 13 indicating a relationship between the charge amount Q and the OCV in the charging process. In contrast, when the secondary battery 2 is discharged, as the OCV is lowered, the charge amount Q is lowered according to a correlation curve 14 indicating a relationship between the charge amount Q and the OCV in the discharging process. The correlation curve indicating the relationship between the charge amount Q and the OCV differs between the charging process and the discharging process, and thus a hysteresis occurs. When charging and discharging are repeatedly performed, the charge amount Q at each OCV in the charging and discharging processes is varied in a hysteresis between the correlation curve 13 indicating the relationship between the charge amount Q and the OCV in the charging process and the correlation curve 14 indicating the relationship between the charge amount Q and the OCV in the discharging process.

In the case of a lithium ion secondary battery, the difference $\alpha Q$ in the charge amount Q at the same OCV in the correlation curve indicating the relationship between the OCV and the charge amount Q between the charging process and the discharging process can be paraphrased by a difference in the amount of lithium accumulated in the negative electrode between the charging and discharging processes. As described above, it can be considered that the difference in the amount of lithium accumulated in the negative electrode is caused by a difference in the state of the lithium present.

Figure 9:
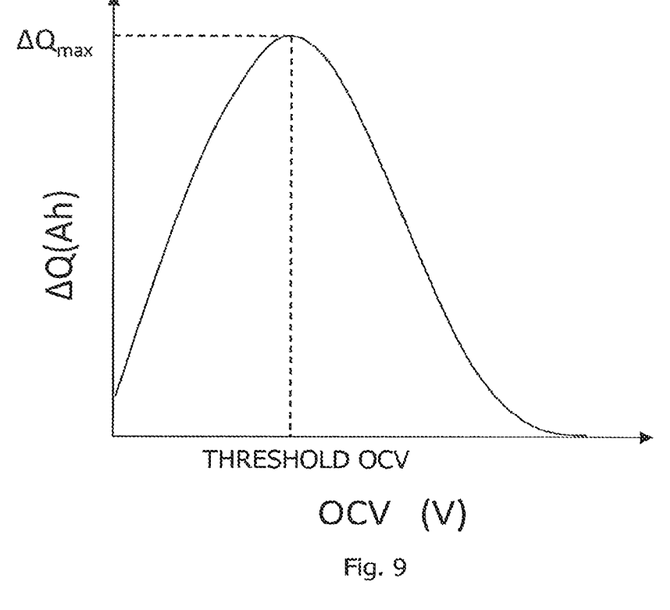
FIG. 9 is a graph showing a relationship between a difference $\Delta Q$ in the charge amount Q and the OCV in the secondary battery in which the correlation curve indicating the relationship between the SOC and the OCV differs between the charging process and the discharging process.

FIG. 9 is a graph showing a relationship between the difference $\alpha Q$ in the charge amount Q and the OCV in the secondary battery 2 in which the correlation curve indicating the relationship between the SOC and the OCV differs between the charging process and the discharging process. In this graph, the maximum value of $\Delta Q$ is represented by $\Delta Q_{max}$, and an OCV at $\Delta Q_{max}$ is represented by the threshold OCV. The threshold OCV can be determined by a graph which is produced in advance and which indicates the relationship between the difference $\Delta Q$ in the charge amount Q and the OCV in the secondary battery 2. At an OCV higher than the threshold OCV, the change of the lithium in the inserted state into the lithium in the coupled state is accelerated whereas at an OCV lower than the threshold OCV, the change of the lithium in the coupled state into the lithium in the inserted state is accelerated, with the result that $\Delta Q$ is decreased.

Although FIG. 9 shows an example of the graph in which the relationship between the difference $\Delta Q$ in the charge amount Q and the OCV in the secondary battery 2 is changed as a quadratic curve, a straight line in which as the OCV is increased, $\Delta Q$ is monotonically decreased or a cubic or more curve can be used. However, in any case, the maximum value of $\Delta Q$ can be represented by AQmax, and an OCV at $\Delta Q_{max}$ can be represented by the threshold OCV. When a plurality of maximum values $\Delta Q_{max}$ are present, the intermediate of a plurality of OCVs corresponding to the maximum values $\Delta Q_{max}$ is preferably assumed to be the threshold OCV.

In the tendency described above, a relational formula 12 is used in which the assignment of weights is switched at the threshold OCV, and in which when the actually measured OCV is lower than the threshold OCV, weights are assigned to the correlation curve 10 indicating the relationship between the SOC and the OCV in the charging process whereas when the actually measured OCV is higher than the threshold OCV, weights are assigned to the correlation curve 11 indicating the relationship between the SOC and the OCV in the discharging process, and thus it can be thought that with consideration given to the stopped state of the secondary battery 2, it is possible to more accurately estimate the SOC of the secondary battery 2.

When the actually measured OCV is lower than the threshold OCV, the relational formula 12 is expressed by, for example, the formula below.

$$SOC_e = \beta/2 \times SOC_d + (1-\beta/2) \times SOC_c$$

where $SOC_e$ is an SOC which is estimated, $SOC_d$ is an SOC which is calculated by introducing the actually measured OCV into the correlation curve 11 indicating the relationship between the SOC and the OCV in the discharging process, $SOC_c$ is an SOC which is calculated by introducing the actually measured OCV into the correlation curve 10 indicating the relationship between the SOC and the OCV in the charging process and $\beta$ is a value which is derived from the maximum value $\Delta Q_{max}$ of a difference $\Delta Q/\Delta Q$ in the charge amount Q at the actually measured OCV in the correlation curve indicating the relationship between the OCV and the charge amount Q in the charging process and the discharging process and is a weight coefficient which has a value of 0 to 1. The weight coefficient $\beta$ is used, and thus it is possible to quantify the magnitude of a variation in the SOC caused by the effect of the state of the presence of lithium at each of the actually measured OCVs.

On the other hand, when the actually measured OCV is higher than the threshold OCV, the relational formula 12 is expressed by, for example, the formula below.

$$SOC_e = \beta/2 \times SOC_c + (1-\beta/2) \times SOC_d$$

where $SOC_e$, $SOC_c$, $SOC_d$ and $\beta$ are the same as those defined as described above.

With the SOC estimation device 7 of the present embodiment which estimates the SOC as described above, in the secondary battery 2 in which the correlation curve indicating the relationship between the SOC and the OCV differs between the charging process and the discharging process, the magnitude of variation in the SOC caused by the effect of the state of the lithium present at each of the actually measured OCVs is quantified, with the result that not only when the secondary battery 2 is being used but also when the use is started after the use of the secondary battery 2 is stopped, it is possible to more accurately estimate the SOC with the actually measured OCV.

Third Embodiment

The present embodiment differs from the first and second embodiments in that the SOC is estimated using the relational formula 12 in which weights are assigned according to the magnitude of an SOC calculated from a charge amount obtained by summing charging current and discharging current in the secondary battery (hereinafter referred to as a "calculated SOC").

Specifically, in the SOC estimation device 7 of the secondary battery 2 according to the present embodiment, the relational formula is used in which as the calculated SOC is higher, weights are assigned to the correlation curve 11 indicating the relationship between the SOC and the OCV in the discharging process and as the calculated SOC is lower, weights are assigned to the correlation curve 10 indicating the relationship between the SOC and the OCV in the charging process. As with the actually measured OCV, according to the magnitude of the calculated SOC, there is a greater tendency for the calculated SOC to follow the correlation curve indicating the relationship between the SOC and the OCV in either the charging process or the discharging process, and thus the relational formula in which weights are assigned to this tendency is used, with the result that it can be felt that with consideration given to the stopped state of the secondary battery 2, it is possible to more accurately estimate the SOC of the secondary battery 2.

In this embodiment, instead of the difference $\alpha Q$ in the charge amount Q in the charging and discharging processes seen in each predetermined OCV, a difference $\Delta$OCV in the OCV in the charging and discharging processes seen in each predetermined SOC is used.

Figure 10:
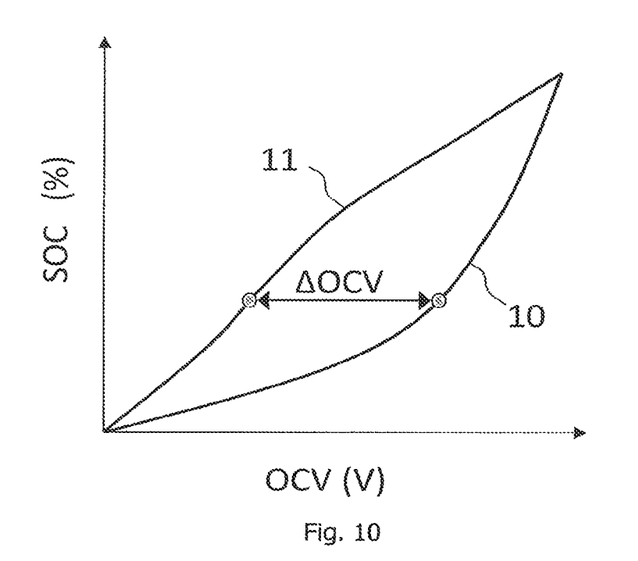
FIG. 10 is a graph showing a correlation curve indicating a relationship between the SOC and the OCV of the secondary battery in which the correlation curve indicating the relationship between the SOC and the OCV differs between the charging process and the discharging process.

FIG. 10 is a graph showing a correlation curve indicating a relationship between the SOC and the OCV of the secondary battery 2 in which the correlation curve indicating the relationship between the SOC and the OCV differs between the charging process and the discharging process.

In the case of a lithium ion secondary battery, the difference $\Delta$OCV in the OCV in the charging and discharging processes seen in each predetermined SOC can be paraphrased by the state of the lithium present in the negative electrode in the charging and discharging processes, in particular, a difference in the amount of lithium in the inserted state which causes a variation in the potential of the negative electrode. In other words, it can be considered that under conditions in which the same amount of lithium is present in the negative electrode, $\Delta$OCV is correlated with the amount of lithium in the inserted state that is changed to lithium in the coupled state.

Figure 11:
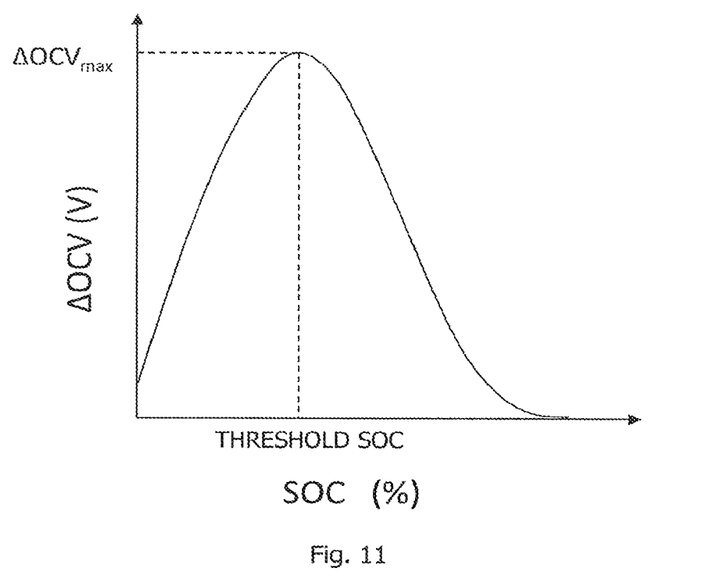
FIG. 11 is a graph showing a relationship between a $\Delta OCV$ and the SOC of the secondary battery in which the correlation curve indicating the relationship between the SOC and the OCV differs between the charging process and the discharging process.

FIG. 11 is a graph showing a relationship between $\Delta$OCV and the SOC of the secondary battery 2 in which the correlation curve indicating the relationship between the SOC and the OCV differs between the charging process and the discharging process. In this graph, the maximum value of $\Delta$OCV is represented by $\Delta OCV_{max}$, and an SOC at $\Delta OCV_{max}$ is represented by the threshold SOC. The threshold SOC can be determined by a graph which is produced in advance and which indicates the relationship between the $\Delta$OCV and the SOC in the secondary battery 2. The $\Delta$OCV is varied by the magnitude of the SOC, and the $\Delta$OCV is the maximum at the threshold SOC. At an SOC higher than the threshold SOC, the change of lithium in the inserted state into lithium in the coupled state is accelerated whereas at an SOC lower than the threshold SOC, the change of lithium in the coupled state into lithium in the inserted state is accelerated, with the result that $\Delta$OCV is decreased.

Although FIG. 11 shows an example of the graph in which the relationship between the $\Delta$OCV and the SOC in the secondary battery 2 is changed as a quadratic curve, a straight line in which as the SOC is increased, $\Delta$OCV is monotonically decreased or a cubic or more curve can be used. However, in any case, the maximum value of $\Delta$OCV can be represented by $\Delta OCV_{max}$, and an SOC at $\Delta OCV_{max}$ can be represented by the threshold SOC. When a plurality of maximum values $\Delta OCV_{max}$ are present, the intermediate of a plurality of SOCs corresponding to the maximum values $\Delta OCV_{max}$ is preferably assumed to be the threshold SOC.

Figure 12:
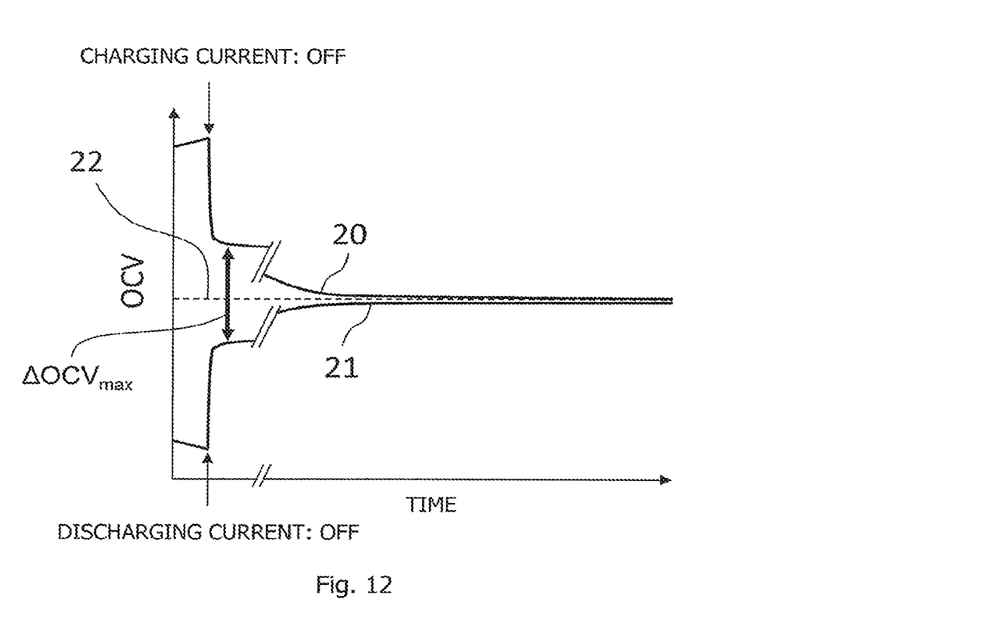
FIG. 12 is a graph showing variations in the OCV with time in the lithium ion secondary battery when, during the charging process and the discharging process, a no load state is retained over a long period of time after the energizing current is stopped at a threshold SOC.

FIG. 12 is a graph showing variations in the OCV with time in the lithium ion secondary battery when in the charging process and the discharging process, the state is retained at no load over a long period of time after the energizing current is stopped in the threshold SOC. When the state is retained at no load over a long period of time in the threshold SOC, as shown in FIG. 12, the OCV 20 when the energization is stopped in the charging process and the OCV 21 when the energization is stopped in the discharging process tend to be brought close to an average OCV 22 which is the average of both thereof.

In the tendency described above, the relational formula 12 is used in which the assignment of weights is switched at the threshold SOC, and in which when as the calculated SOC is lower than the threshold SOC, weights are assigned to the correlation curve 10 indicating the relationship between the SOC and the OCV in the charging process whereas as the calculated SOC is higher than the threshold SOC, weights are assigned to the correlation curve 11 indicating the relationship between the SOC and the OCV in the discharging process, and thus it can be felt that with consideration given to the stopped state of the secondary battery 2, it is possible to more accurately estimate the SOC of the secondary battery 2.

As the calculated SOC is lower than the threshold SOC, the SOC calculated by introducing the actually measured OCV into the correlation curve 10 indicating the relationship between the SOC and the OCV in the charging process becomes more accurate whereas as the calculated SOC is higher than the threshold SOC, the magnitude of error is increased. In contrast, as the calculated SOC is higher than the threshold SOC, the SOC calculated by introducing the actually measured OCV into the correlation curve 11 indicating the relationship between the SOC and the OCV in the discharging process becomes more accurate whereas as the calculated SOC is lower than the threshold SOC, the magnitude of error is increased. Hence, the two correlation curves, that is, the correlation curve 10 indicating the relationship between the SOC and the OCV in the charging process and the correlation curve 11 indicating the relationship between the SOC and the OCV in the discharging process are synthesized using a weight coefficient $\gamma$ which is changed according to the magnitude of the calculated SOC, a relational formula 12 indicating the relationship between the calculated SOC and the synthesized OCV is newly produced and thus it is possible to cancel out the mutual disadvantages and maximize the advantages.

When the calculated SOC is lower than the threshold SOC, the synthesized OCV in the relational formula 12 is calculated by, for example, the formula below.

$$OCV_m = \gamma/2 \times OCV_d + (1-\gamma/2) \times OCV_c$$

where $OCV_m$ is the synthesized OCV in the calculated SOC, $OCV_d$ is an OCV which is calculated by introducing the calculated SOC into the correlation curve 11 indicating the relationship between the SOC and the OCV in the discharging process, $OCV_c$ is an OCV which is calculated by introducing the calculated SOC into the correlation curve 10 indicating the relationship between the SOC and the OCV in the charging process and $\gamma$ is a value which is derived from the maximum value $\Delta OCV_{max}$ of a difference $\Delta OCV/\Delta OCV$ of the OCV at the calculated SOC in the correlation curve indicating the relationship between the SOC and the OCV in the charging process and the discharging process and which is a weight coefficient having a value of 0 to 1. The weight coefficient γ is used, and thus it is possible to quantify the magnitude of variation in the OCV caused by the effect of the state of the lithium present at each of the actually measured OCVs.

On the other hand, when the calculated SOC is higher than the threshold SOC, the synthesized OCV of the relational formula 12 is expressed by, for example, the formula below.

$$OCV_m = \gamma/2 \times OCV_c + (1-\gamma/2) \times OCV_d$$

where $OCV_m$, $OCV_c$, $OCV_d$ and γ are the same as those defined as described above.

Then, the relational formula 12 of the synthesized OCV and the calculated SOC calculated by the above formula are determined in advance, the actually measured OCV is introduced into the relational formula 12 and the SOC is thus estimated.

With the SOC estimation device 7 of the present embodiment which estimates the SOC as described above, in the secondary battery 2 in which the correlation curve indicating the relationship between the SOC and the OCV differs between the charging process and the discharging process, the magnitude of variation in the OCV caused by the effect of the state of the lithium present at each of the calculated SOCs is quantified, with the result that not only when the secondary battery 2 is being used but also when the use is started after the use of the secondary battery 2 is stopped, it is possible to more accurately estimate the SOC.

Figure 13:
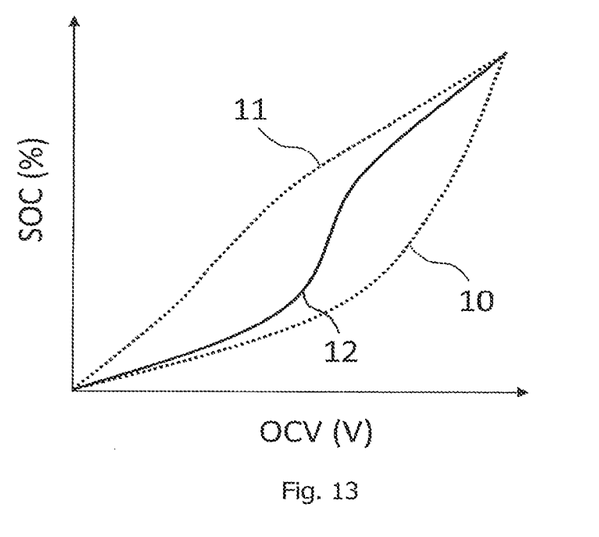
FIG. 13 is a graph showing a relational formula in which weights are assigned in second and third embodiments.

FIG. 13 shows the relational formula 12 in which weights are assigned in the second and third embodiments. As shown in FIG. 13, in the relational formula 12 in which weights are assigned in the second and third embodiments, as the actually measured OCV or the calculated SOC is increased, weights are assigned to the correlation curve 11 indicating the relationship between the SOC and the OCV in the discharging process whereas as the actually measured OCV or the calculated SOC is decreased, weights are assigned to the correlation curve 10 indicating the relationship between the SOC and the OCV in the charging process.

Fourth embodiment

In the secondary battery 2, the battery capacity is lowered as charging and discharging are performed or as time passes. The lowering of the battery capacity can be represented by use of an SOH (State of Health). A correlation curve indicating a relationship between the SOC and the OCV is changed in shape as the SOH is lowered. Hence, in order to accurately estimate the SOC, it is necessary to consider the lowering of the SOH.

In the present embodiment, a description will be given of the SOC estimation device 7 of the secondary battery 2 where it possible to enhance the accuracy of the estimation of the SOC by further adding conditions in which the lowering of the SOH is reflected on the correlation curve used in the assignment of weights in the first to third embodiments.

The lowering of the SOH is mainly caused by the degradation of various types of materials of the secondary battery 2. For example, in the secondary battery 2 which has a negative electrode using hard carbon as a negative electrode active substance, as charging and discharging are performed or as time passes in the secondary battery 2, part of a graphene layer is destroyed and divided. Hence, the number of end parts of the graphene layer is increased, and thus as compared with lithium in the inserted state, the proportion of lithium in the coupled state is increased. In other words, the lowering of the SOH promotes the change of lithium in the inserted state to lithium in the coupled state.

In the secondary battery 2 (the secondary battery 2 where the SOH is not lowered) in the initial state, in the discharging process, the desorption of lithium preferentially proceeds from the lithium in the inserted state, and as the discharging proceeds, part of the lithium in the coupled state is gradually changed into the lithium in the inserted state. In contrast, in the secondary battery 2 where the SOH is lowered, as compared with the secondary battery 2 in the initial state, the proportion of lithium in the inserted state is low. Since the OCV significantly depends on the amount of lithium in the inserted state, in the same SOC, as the SOH is lowered, the OCV is lowered.

There is a tendency that as the SOH is lowered, in the correlation curve indicating the relationship between the SOC and the OCV, the variation in the OCV is increased around the SOC (threshold SOC) where ΔOCV (the difference in the OCV in the charging and discharging processes seen in each predetermined SOC) is maximized. In other words, in the secondary battery 2 where the SOH is lowered, in each SOC, the OCV is not uniformly varied, and the amount of variation in the OCV in each SOC indicates the same behavior as the variation in the ΔOCV in each SOC.

The SOH is the proportion of battery capacity after use to battery capacity in the initial state (which is also referred to as "full charge capacity"). Specifically, the SOH can be calculated by use of the formula below.

$$SOH = \text{battery capacity after use/battery capacity in initial state} \times 100$$

In the present embodiment, the correlation curve indicating the relationship between the SOC and the OCV is determined in advance in each constant SOH, and the correlation curve corresponding to the calculated SOH is selected and used. As the correlation curve used in the assignment of weights, the correlation curve corresponding to the calculated SOH is selected, and thus it is possible to consider an effect caused by the lowering of the SOH, with the result that it is possible to accurately estimate the SOC. The SOC estimated as described above is fed back and is repeatedly calculated when the SOH is calculated, and thus it is possible to accurately calculate the SOH. Consequently, it is possible to more accurately estimate the SOC.

Figure 14:
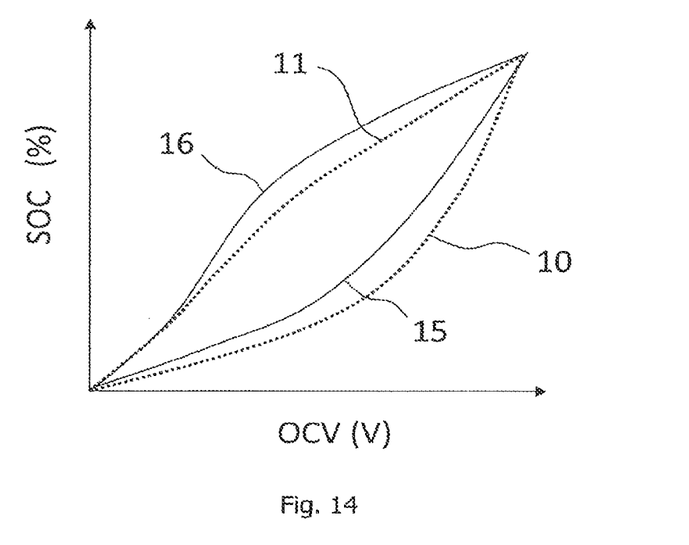
FIG. 14 is a graph showing correlation curves indicating the relationship between the SOC and the OCV of the secondary battery in the initial state and the secondary battery where an SOH is lowered.

FIG. 14 is a graph showing correlation curves indicating the relationship between the SOC and the OCV of the secondary battery 2 in the initial state and the secondary battery 2 where the SOH is lowered. In FIG. 14, dotted lines represent the correlation curve indicating the relationship between the SOC and the OCV in the secondary battery 2 in the initial state, and solid lines represent the correlation curve indicating the relationship between the SOC and the OCV in the secondary battery 2 where the SOH is lowered. As shown in FIG. 14, there is a tendency that in the secondary battery 2 where the SOH is lowered, as compared with the secondary battery 2 in the initial state, the OCV in the same SOV is lowered. In the secondary battery 2 where the SOH is lowered, when charging is performed, as the SOC is increased from 0 to 100% according to the correlation curve 15 indicating the relationship between the SOC and the OCV in the charging process, the OCV is increased. In contrast, when discharging is performed, as the SOC is lowered from 100 to 0% according to the correlation curve 16 indicating the relationship between the SOC and the OCV in the discharging process, the OCV is lowered. As in the secondary battery 2 in the initial state, even in the secondary battery 2 where the SOH is lowered, the correlation curve indicating the relationship between the SOC and the OCV differs between the charging and discharging processes, and thus a hysteresis occurs. This is because even in the secondary battery 2 where the SOH is lowered, the change of the state of lithium proceeds in the same mechanism as in the secondary battery 2 in the initial state.

Figure 15:
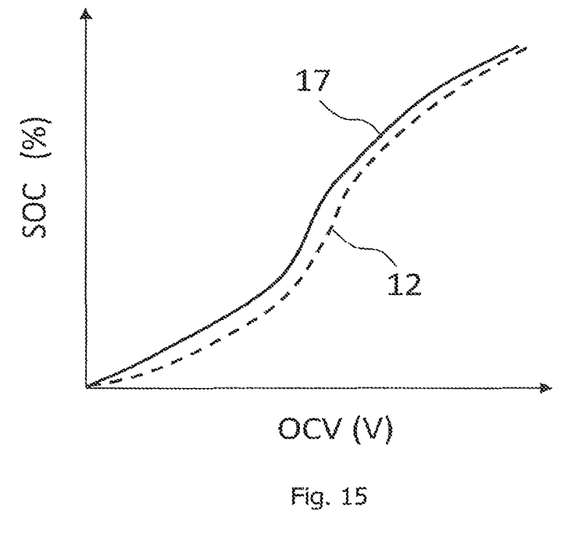
FIG. 15 shows an example where one relational formula is used as a relational formula in which weights are assigned to correlation curves indicating the relationship between the SOC and the OCV of the secondary battery in the initial state and the secondary battery where the SOH is lowered.

FIG. 15 shows an example where one relational formula is used as relational formulae in which weights are assigned to correlation curves indicating the relationship between the SOC and the OCV of the secondary battery 2 in the initial state and the secondary battery 2 where the SOH is lowered. In FIG. 15, a dotted line represents the relational formula 12 in which weights are assigned in the secondary battery 2 in the initial state, and a solid line represents another relational formula 17 in which weights are assigned in the secondary battery 2 where the SOH is lowered. In the other relational formula 17, as the actually measured OCV is higher, weights are assigned to the correlation curve 16 indicating the relationship between the SOC and the OCV in the discharging process whereas as the actually measured OCV is lower, weights are assigned to the correlation curve 15 indicating the relationship between the SOC and the OCV in the charging process. With the other relational formula 17, it is possible to consider the effect caused by the lowering of the SOH, and thus it is possible to accurately estimate the SOC.

The method for assigning weights is as described in the first to third embodiments.

With the SOC estimation device 7 of the present embodiment which estimates the SOC as described above, in the secondary battery 2 in which the correlation curve indicating the relationship between the SOC and the OCV differs between the charging process and the discharging process, since consideration is given to the effect caused by the lowering of the SOH, not only when the secondary battery 2 is being used but also when the use is started after the use of the secondary battery 2 is stopped, it is possible to more accurately estimate the SOC.

Since the relational formula 12 in which weights are assigned in the first to fourth embodiments is varied with the battery temperature, the relational formula 12 for each battery temperature is produced in advance, the battery temperature is measured with the temperature sensor 5 when the SOC is estimated and the relational formula 12 corresponding to the measured battery temperature is used, with the result that it is possible to enhance the accuracy of the estimation of the SOC.

Although in the relational formula 12 in which weights are assigned in the first to fourth embodiments, weights are assigned, in each SOC or OCV, to the correlation curve 10 indicating the relationship between the SOC and the OCV in the charging process and the correlation curve 11 indicating the relationship between the SOC and the OCV in the discharging process, weights may be assigned, in each typical SOC or OCV, and linear interpolation may be performed therebetween.

With the SOC estimation device 7 of the first to fourth embodiments in the secondary battery 2 in which the correlation curve indicating the relationship between the SOC and the OCV differs between the charging process and the discharging process, it is possible to solve the problem in which a significant error in the estimation of the SOC is produced immediately after the start of the use of the secondary battery 2, with the result that it is possible to accurately estimate the SOC not only when the secondary battery 2 is being used but also when the use is started after the use of the secondary battery 2 is stopped.

Since the SOC estimation device 7 of the first to fourth embodiments has the features described above, for example, the SOC estimation device 7 is suitably used for the power storage system of an elevator in which charging and discharging are frequently performed in the daytime and are stopped in the nighttime. Furthermore, the SOC estimation device 7 is also suitably used for a transport device such as a vehicle in which charging and discharging are frequently performed and stopped.

This international application claims priority based on Japanese Patent Application No. 2014-33633 filed on Feb. 25, 2014, the entire contents of which are incorporated in the international application.

REFERENCE SIGNS LIST

1: BMU, 2: secondary battery, 3: voltage sensor, 4: current sensor, 5: temperature sensor, 6: motor, 7: SOC estimation device, 8: control portion, 10, 15: correlation curve indicating relationship between SOC and OCV in charging process, 11, 16: correlation curve indicating relationship between SOC and OCV in discharging process, 12: relational formula, 13: correlation curve indicating relationship between charge amount Q and OCV in charging process, 14: correlation curve indicating relationship between charge amount Q and OCV in discharging process, 20: OCV when energization is stopped in charging process, 21: OCV when energization is stopped in discharging process, 22: average OCV

The invention claimed is:

1. A battery management device for a secondary battery in which a correlation curve indicating a relationship between a State of Charge (SOC) and an Open Circuit Voltage (OCV) differs between a charging process and a discharging process, the battery management device comprising:
    a voltage sensor configured to measure the actual OCV of the secondary battery;
    a State of Charge (SOC) estimation device configured to estimate the SOC based on a relational formula in which as the measured actual OCV is increased, weights are assigned to the correlation curve indicating the relationship between the SOC and the OCV in the discharging process, and as the measured actual OCV is decreased, weights are assigned to the correlation curve indicating the relationship between the SOC and the OCV in the charging process,
    a charge controller configured to charge the secondary battery based on the SOC estimated;
    wherein in the SOC estimation device the OCV at which a difference ΔQ in a charge amount Q at the same OCV is maximized, in a correlation curve indicating a relationship between the OCV and the charge amount Q in the charging process and the discharging process, is a threshold OCV, and the SOC estimation device estimates the SOC based on a relational formula in which as the measured actual OCV becomes smaller than the threshold OCV, weights are assigned to the correlation curve indicating the relationship between the SOC and the OCV in the charging process, and as the measured actual OCV becomes greater than the threshold OCV, weights are assigned to the correlation curve indicating the relationship between the SOC and the OCV in the discharging process, and
    the secondary battery is charged based on the SOC estimated.

2. The battery management device for a secondary battery according to claim 1, wherein when the measured actual OCV is less than the threshold OCV, the relational formula is the following formula:

$$SOC_e = \beta/2 \times SOC_d + (1-\beta/2) \times SOC_c$$

where $SOC_e$, is an estimated SOC, $SOC_d$ is an SOC calculated by introducing the measured actual OCV into the correlation curve indicating the relationship between the SOC and the OCV in the discharging process, $SOC_c$ is an SOC calculated by introducing the measured actual OCV into the correlation curve indicating the relationship between the SOC and the OCV in the charging process and β is a value derived from a maximum value $\Delta Q_{max}$ of a difference ΔQ/ΔQ in the charge amount Q at the measured actual OCV in the correlation curve indicating the relationship between the OCV and the charge amount Q in the charging process and the discharging process and is a weight coefficient which has a value of 0 to 1 and when the measured actual OCV is greater than the threshold OCV, the relational formula is the following formula:

$$SOC_e = \beta/2 \times SOC_c + (1-\beta/2) \times SOC_d$$

where $SOC_e$, $SOC_c$, $SOC_d$ and β are as defined above.

3. The battery management device for a secondary battery according to claim 1, wherein the correlation curve indicating the relationship between the SOC and the OCV is determined, in advance, for each of a plurality of State of Health (SOH), and as the correlation curve used for the assignment of weights, a correlation curve corresponding to a calculated SOC is selected.

4. A method for estimating an State of Charge (SOC) of a secondary battery in which a correlation curve indicating a relationship between an SOC and an Open Circuit Voltage (OCV) differs between a charging process and a discharging process, the method comprising:

estimating the SOC based on a relational formula in which as a measured actual OCV is increased, weights are assigned to the correlation curve indicating the relationship between the SOC and the OCV in the discharging process, and as the measured actual OCV is decreased, weights are assigned to the correlation curve indicating the relationship between the SOC and the OCV in the charging process, wherein the OCV at which a difference ΔQ in a charge amount Q at the same OCV is maximized, in a correlation curve indicating a relationship between the OCV and the charge amount Q in the charging process and the discharging process, is a threshold OCV, and the SOC is estimated based on a relational formula in which as the measured actual OCV becomes smaller than the threshold OCV, weights are assigned to the correlation curve indicating the relationship between the SOC and the OCV in the charging process, and as the measured actual OCV becomes greater than the threshold OCV, weights are assigned to the correlation curve indicating the relationship between the SOC and the OCV in the discharging process, and the secondary battery is charged based on the SOC estimated.

* * * * *